(12) United States Patent
Kageyama

(10) Patent No.: US 9,692,981 B2
(45) Date of Patent: Jun. 27, 2017

(54) IMAGE PICKUP APPARATUS WITH EMISSION UNIT, CONTROL METHOD THEREFOR, AND STORAGE MEDIUM STORING CONTROL PROGRAM THEREFOR

(71) Applicant: CANON KABUSHIKI KAISHA, Tokyo (JP)

(72) Inventor: Takashi Kageyama, Yokosuka (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 14/859,696

(22) Filed: Sep. 21, 2015

(65) Prior Publication Data

US 2016/0094769 A1 Mar. 31, 2016

(30) Foreign Application Priority Data

Sep. 29, 2014 (JP) ................................ 2014-198502

(51) Int. Cl.
*H04N 5/235* (2006.01)
*H04N 5/232* (2006.01)
*H04N 5/369* (2011.01)

(52) U.S. Cl.
CPC ......... *H04N 5/2351* (2013.01); *H04N 5/2354* (2013.01); *H04N 5/23212* (2013.01); *H04N 5/3696* (2013.01)

(58) Field of Classification Search
USPC ................................................ 348/349, 371
See application file for complete search history.

(56) References Cited

U.S. PATENT DOCUMENTS

| 6,385,402 | B1 * | 5/2002 | Nakata | G03B 13/36 |
| | | | | 396/121 |
| 2008/0284901 | A1 * | 11/2008 | Misawa | G02B 7/36 |
| | | | | 348/349 |
| 2009/0153727 | A1 * | 6/2009 | Shimoda | G03B 15/05 |
| | | | | 348/362 |

(Continued)

FOREIGN PATENT DOCUMENTS

| JP | 04-355733 A | 12/1992 | | |
| WO | WO 2013077154 A1 * | 5/2013 | ............. | G03B 13/36 |

*Primary Examiner* — Robreto Velez
*Assistant Examiner* — Cynthia Segura
(74) *Attorney, Agent, or Firm* — Cowan, Liebowitz & Latman, P.C.

(57) ABSTRACT

An image pickup apparatus capable of obtaining focusing information at the time of photometry for emission control and of controlling an emission quantity appropriately. An image pickup device receives a pair of light beams that pass through different pupil division areas of an imaging optical system with a pair of photoelectric conversion sections. An extraction unit extracts candidates from a pre-emission image. A calculation unit finds focused areas and defocus areas in the pre-emission image. A selection unit selects a light-control target area from the candidates according to information about the focused areas. A control unit controls emission quantity so that luminance in the light-control target area becomes predetermined luminance. The calculation unit finds the information about the focused areas based on difference information between a first phase difference signal read from one photoelectric conversion section and a second phase difference signal read from the other photoelectric conversion section.

5 Claims, 10 Drawing Sheets

(56) References Cited

U.S. PATENT DOCUMENTS

| | | | |
|---|---|---|---|
| 2012/0314117 A1* | 12/2012 | Irie | H04N 5/23212 348/333.02 |
| 2013/0293745 A1* | 11/2013 | Tamura | H04N 5/2351 348/234 |
| 2014/0267865 A1* | 9/2014 | Kishi | G03B 13/36 348/310 |
| 2014/0285707 A1* | 9/2014 | Ogawa | H04N 5/3572 348/353 |
| 2014/0333823 A1* | 11/2014 | Sakaguchi | H04N 5/23212 348/353 |

* cited by examiner

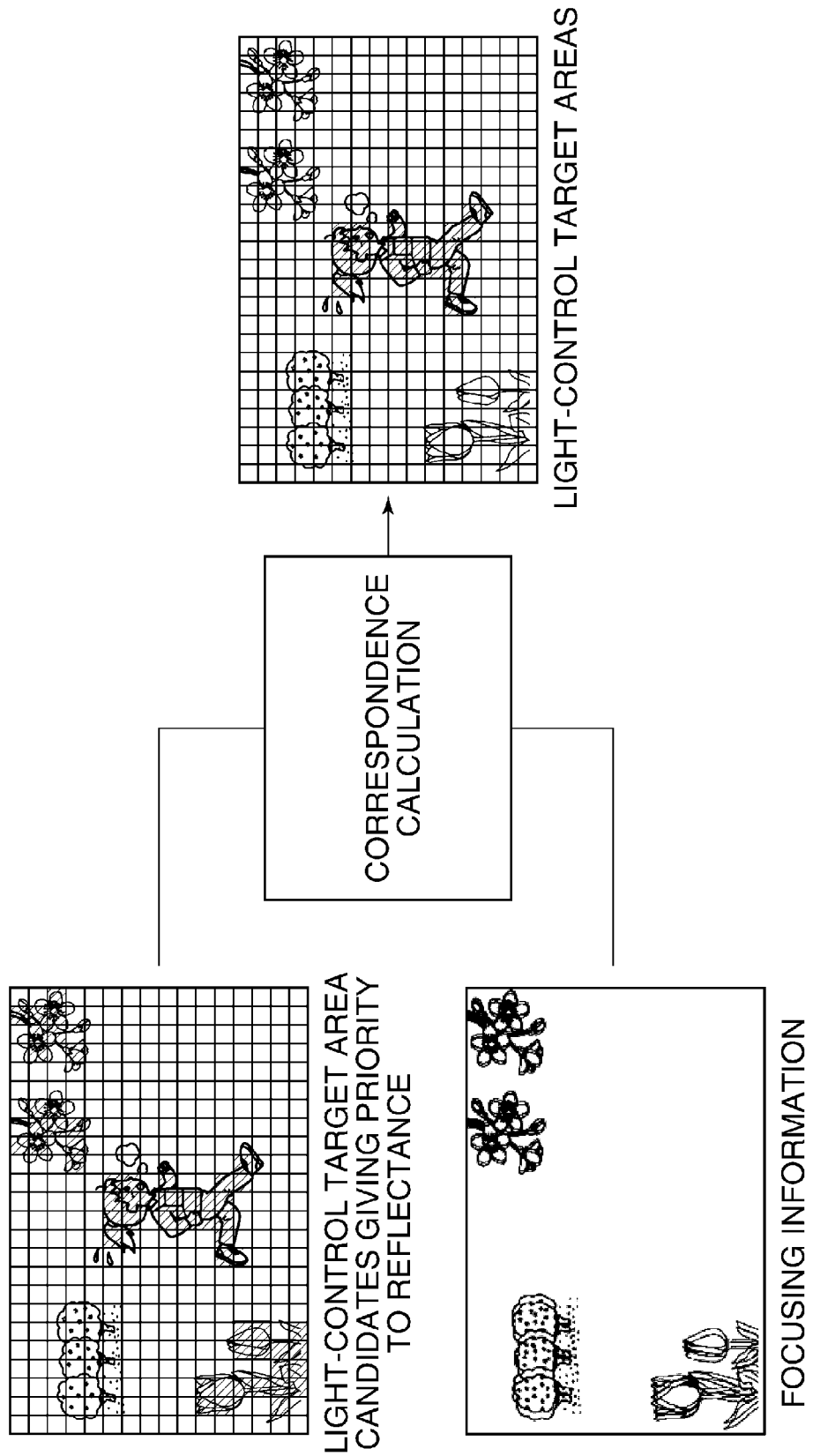

IMAGE PICKUP APPARATUS WITH EMISSION UNIT, CONTROL METHOD THEREFOR, AND STORAGE MEDIUM STORING CONTROL PROGRAM THEREFOR

BACKGROUND OF THE INVENTION

Field of the Invention

The present invention relates to an image pickup apparatus with an emission unit, a control method therefor, and a storage medium storing a control program therefor, and in particular, relates to emission control of a light emission device, such as a flash device that is used in an image pickup apparatus.

Description of the Related Art

In general, there are some image pickup apparatuses like digital cameras that are equipped with light emission devices like flash devices. Furthermore, there is a known system in which a light emission device is located at a position away from an image pickup apparatus and is controlled by wireless control, for example, to photograph.

Moreover, although photographing in a dark photographing scene etc. is becoming possible because an S/N characteristic of an image pickup sensor, such as a CMOS image sensor, improves, it is necessary to control an irradiating light quantity (an emission quantity) of a light emission device with sufficient accuracy.

In order to control an emission quantity with sufficient accuracy, it is required to extract correctly a main object of which brightness should be controlled properly. For example, there is a technique that performs light control by calculating a plurality of photometry outputs obtained by dividing reflected light from a field into a plurality of areas and by measuring while operating a ratio contributing to light control according to focusing information (see Japanese Laid-Open Patent Publication (Kokai) No. H4-355733 (JP H4-355733A)).

On the other hand, there is an image pickup sensor that is mounted in an image pickup apparatus and that obtains a plurality of image signals by allocating a plurality of pixels to one micro lens (ML) to separate a pupil (pupil division). Then, this kind of image pickup apparatus performs a phase difference AF control according to the image signals concerned.

In the image pickup apparatus equipped with such an image pickup sensor, the information used in the phase difference AF control can be utilized for controlling an emission quantity with sufficient accuracy at the time of photographing by emitting a light emission device (flash photographing).

For example, there is a technique that obtains distance distribution of areas in an image using a pair of image signals (i.e., a phase difference image) and that removes light distribution unevenness of the light emission using the distance distribution concerned.

Incidentally, one of photographing effects by a flash photographing is what is called "to stop a moving object". When photographing an object with proper luminance under low illumination, short-time irradiation (an order of some tens through some hundreds of microseconds) of strong light by a light emission device stops an object, and gives an image that is free from a camera shake and an image blur.

In order to control an emission quantity with sufficient accuracy with respect to a moving object, it is necessary to extract the moving object concerned correctly. For the purpose, it is useful to use the focusing information.

However, the emission control disclosed in the abovementioned publication needs to obtain the focusing information in addition to the photometry information for the emission control. Accordingly, when a moving object is photographed, a mismatch due to time deviation occurs between a position of the object at the time of photographing and the focusing information used for the emission control.

SUMMARY OF THE INVENTION

The present invention provides an image pickup apparatus, a control method therefor, and a storage medium storing a control program therefor, which are capable of obtaining focusing information at the time of photometry for emission control and of controlling an emission quantity appropriately by extracting an object with sufficient accuracy even if the object is moving.

Accordingly, a first aspect of the present invention provides an image pickup apparatus comprising an image pickup device that receives a pair of light beams that pass through different pupil division areas of an imaging optical system with a pair of photoelectric conversion sections, an emission unit that illuminates an object, an extraction unit configured to extract light-control target area candidates from a pre-emission image that is obtained by pre-emitting the emission unit using a non-emission image and the pre-emission image, a calculation unit configured to find focused areas and defocus areas in the pre-emission image based on the pre-emission image, a selection unit configured to select a light-control target area that should be a target of light control from the light-control target area candidates according to information about the focused areas, and a control unit configured to control emission quantity of the emission unit at a time of photographing so that luminance in the light-control target area becomes predetermined luminance. The calculation unit finds the information about the focused areas based on difference information between a first phase difference signal read from one photoelectric conversion section of the pair of photoelectric conversion sections and a second phase difference signal read from the other photoelectric conversion section of the pair of photoelectric conversion sections.

Accordingly, a second aspect of the present invention provides a control method for an image pickup apparatus that is provided with an image pickup device that receives a pair of light beams that pass through different pupil division areas of an imaging optical system with a pair of photoelectric conversion sections and an emission unit that illuminates an object, the control method comprising an extraction step of extracting light-control target area candidates from a pre-emission image that is obtained by pre-emitting the emission unit using a non-emission image and the pre-emission image, a calculation step of finding focused areas and defocus areas in the pre-emission image based on the pre-emission image, a selection step of selecting a light-control target area that should be a target of light control from the light-control target area candidates according to information about the focused areas, and a control step of controlling emission quantity of the emission unit at a time of photographing so that luminance in the light-control target area becomes predetermined luminance. The information about the focused areas is found based on difference information between a first phase difference signal read from one photoelectric conversion section of the pair of photoelectric conversion sections and a second phase difference signal read from the other photoelectric conversion section of the pair of photoelectric conversion sections in the calculation step.

Accordingly, a third aspect of the present invention provides a non-transitory computer-readable storage medium storing a control program causing a computer to execute the control method of the second aspect.

According to the present invention, a light-control target area that should be a target of light control is selected form light-control target area candidates according to the focusing information, and the emission quantity at the time of photographing is controlled so that the luminance in the light-control target area concerned becomes the predetermined luminance. As a result of this, the focusing information about the object is obtained at the time of the photometry for the emission control, the object is extracted with sufficient accuracy even if the object is moving, and the emission quantity is controlled appropriately.

Further features of the present invention will become apparent from the following description of exemplary embodiments with reference to the attached drawings.

BRIEF DESCRIPTION OF THE DRAWINGS

FIG. 10 is a view for describing extraction of a light-control target area shown in FIG. 5.

DESCRIPTION OF THE EMBODIMENTS

Hereafter, one example of an image pickup apparatus that is equipped with a light emission control device according to an embodiment of the present invention will be described in detail with reference to the drawings.

Figure 1:
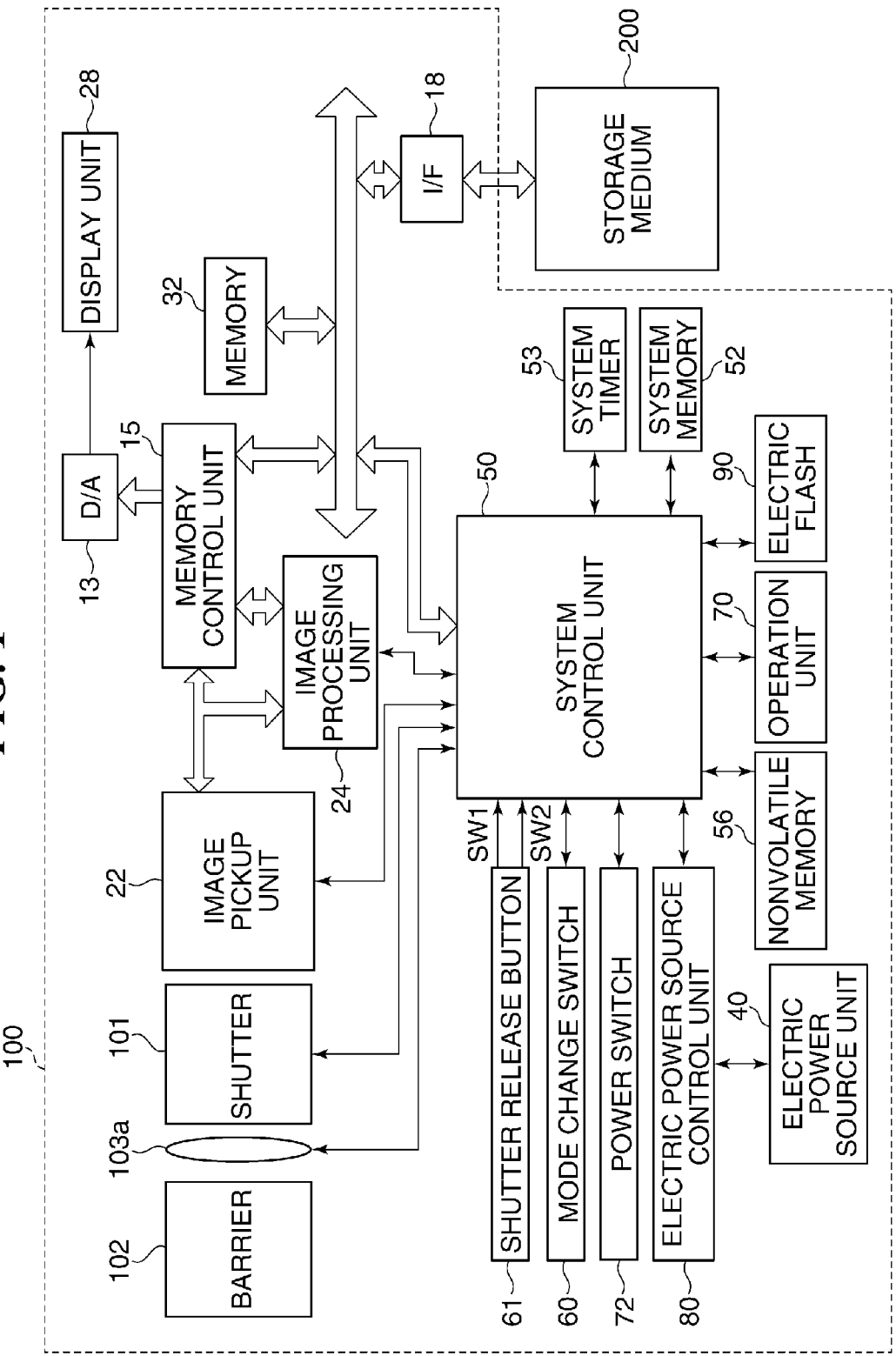
FIG. 1 is a block diagram schematically showing a configuration of an image pickup apparatus (camera) according to an embodiment of the present invention.

FIG. 1 is a block diagram schematically showing a configuration of an image pickup apparatus according to an embodiment of the present invention.

The illustrated image pickup apparatus is a digital camera (hereinafter referred to as a camera) 100, for example, and has a photographing lens unit (hereinafter referred to as a photographing lens) 103a. This photographing lens 103a is a lens group including a zoom lens and a focus lens. A shutter 101 is arranged behind the photographing lens 103a, and this shutter 101 has a function of a diaphragm.

An image pickup unit 22 is arranged behind the shutter 101. The image pickup unit 22 is an image pickup sensor equipped with an image pickup device like a CCD or CMOS device that converts an optical image (an object image) into an electrical signal. Furthermore, the image pickup unit 22 is provided with an A/D conversion processing function. It should be noted that the configuration of the image pickup sensor is mentioned later.

A barrier 102 prevents the photographing lens 103a, shutter 101, and image pickup unit 22 from staining and breaking by covering the image pickup system including the photographing lens 103a. Emission of an electric flash 90 as the emission device is selectively controlled at the time of photographing to illuminate an object in a low-illumination photographing scene or a backlight scene, for example.

An image processing unit 24 applies a predetermined pixel interpolation, a resizing process like a reducing process, and a color conversion process to the image data output from the image pickup unit 22 or the image data from a memory control unit 15. Moreover, the image processing unit 24 performs a predetermined calculation process using the image data obtained as a result of photographing. Then, a system control unit 50 performs exposure control and ranging control on the basis of the calculated result obtained by the image processing unit 24. According to these controls, an AE (automatic exposure) process, and an EF (automatic flash-light control emission) process of a TTL (through the lens) system are performed.

Furthermore, the image processing unit 24 performs an AF (autofocus) process, performs a predetermined calculation process using the image data obtained as a result of photographing, and performs an AWB (automatic white balance) process of the TTL system on the basis of the calculated result concerned.

The image data output from the image pickup unit 22 is written into a memory 32 via the image processing unit 24 and the memory control unit 15 or via the memory control unit 15. The memory 32 stores the image data obtained as a result of photographing, and serves as a memory for displaying an image (video memory) in which display image data that is displayed on a display unit 28 is stored. It should be noted that the memory 32 has sufficient memory capacity for storing still images of the predetermined number, moving images and voice of predetermined time. The display unit 28 is an LCD, for example.

A D/A converter 13 converts the display image data stored in the memory 32 into an analog image signal, and transmits it to the display unit 28. Accordingly, an image corresponding to the display image data is displayed on the display unit 28.

Since the image data, which is once A/D-converted by the image pickup unit 22 and is stored in the memory 32, is D/A-converted by the D/A converter 13 and is successively transmitted to the display unit 28 to display, the display unit 28 functions as an electronic view finder, and displays a through image.

A nonvolatile memory 56 is a memory, such as a flash memory, which is able to erase and to record electrically. The nonvolatile memory 56 stores constants, programs, etc. for the operation of the system control unit 50.

The system control unit 50 controls the whole camera 100. The system control unit 50 executes the programs recorded in the nonvolatile memory 56 mentioned above to perform the processes mentioned later. The constants and variables for the operation of the system control unit 50 and the programs read from the nonvolatile memory 56 will be developed to a system memory 52. It should be noted that the system control unit 50 controls the memory 32, the D/A converter 13, the display unit 28, etc. to perform a display process.

A system timer 53 is a time check unit that measures time periods used for various control operations and time of a built-in clock. A mode change switch 60, a shutter release button 61, a power switch 72, and an operation unit 70 are used when inputting various kinds of operation instructions to the system control unit 50.

The mode change switch 60 selects the operation mode of the system control unit 50 from among a still image recording mode, a moving image recording mode, and a replay mode, etc. The still image recording mode includes an automatic photographing mode, automatic scene discrimination mode, manual mode, various scene modes used as photographing settings according to photographing scenes, programmed AE mode, and custom mode, for example.

Any one of the modes included in the still image recording mode is directly selectable by using the mode change switch 60. Alternatively, a configuration where any one of the modes included in the still image recording mode is selected by using another operation member after the still image recording mode is selected by using the mode change-over switch 60 may be employed. Similarly, the moving image photographing mode may also include a plurality of modes.

When the shutter release button 61 is half-pressed (a photographing-preparation instruction), a first shutter switch turns ON and a first shutter switch signal SW1 is sent to the system control unit 50. Then, the operations of the AF (autofocus) process, AE (automatic exposure) process, AWB (automatic white balance) process, EF (automatic flash-light control emission) process, etc. start in response to the first shutter switch signal SW1 under the control of the system control unit 50.

When the shutter release button 61 is pressed fully (a photographing instruction), a second shutter switch turns ON and a second shutter switch signal SW2 is sent to the system control unit 50. The system control unit 50 starts a series of operations of the photographing process from reading of signal of the image pickup unit 22 until writing of image data into the storage medium 200 in response to the second shutter switch signal SW2.

Functions are suitably assigned to the operation members of the operation unit 70 by selecting various function icons displayed on the display unit 28. Then, the operation members act as various function buttons. There are a menu button, SET button, end button, back button, next image button, jump button, narrowing button, and attribute changing button, etc. as the function buttons. Moreover, the operation unit 70 is provided with a controller wheel that functions also as a vertical and horizontal four direction button as one of the operating members. For example, when the menu button is depressed, a menu screen for performing various settings is displayed on the display unit 28. A user is able to perform various settings intuitively by using the menu screen displayed on the display unit 28, the four direction button of the controller wheel, and the SET button.

A rotary operation of the controller wheel generates an electric pulse signal corresponding to the operation quantity, and the system control unit 50 controls the camera 100 on the basis of the pulse signal. The system control unit 50 determines rotation angle and rotational frequency of the controller wheel based on the pulse signal.

It should be noted that any operation member may be employed as the controller wheel as long as the rotary operation can be detected. For example, the controller wheel may be a dial operating member that generates the pulse signal by a rotation of itself according to a user's rotary operation. Alternatively, the controller wheel may be an operating member that consists of touch sensors and detects a rotary operation of a user's finger on the controller wheel 73 without rotating the controller wheel itself (what is called a touch wheel).

An electric power source control unit 80 consists of a battery detector, a DC-DC converter, a switching circuit that changes a block to which electric current is supplied, etc., and detects whether a battery is mounted, the type of a battery, and battery residue. The electric power source control unit 80 controls the DC-DC converter based on the detection result and instructions from the system control unit 50, and supplies a required voltage to the respective units including the storage medium 200 during a required period.

An electric power source unit 40 has a primary battery, such as an alkaline battery or a lithium battery, or a secondary battery, such as a NiCd battery, a NiMH battery, or a Li battery, and is connectable with an AC/DC adaptor. A storage-medium I/F 18 is an interface with the storage medium 200, such as a memory card (semiconductor memory) or a hard disk. The image data obtained as a result of photographing is recorded to the storage medium 200.

Figure 2A:
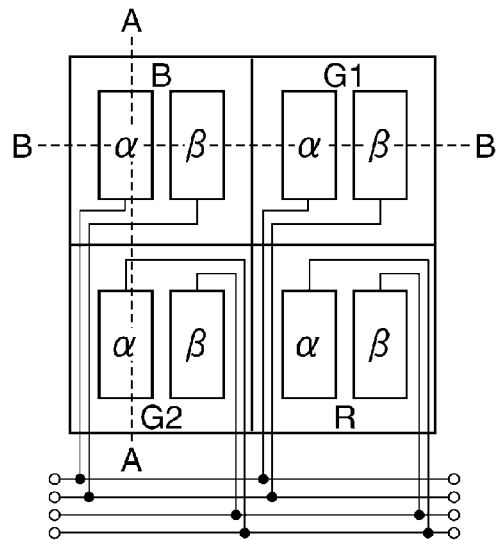
FIG. 2A, FIG. 2B, and FIG. 2C are plan views schematically showing first, second, and third examples of an image sensor with which the image pickup unit shown in FIG. 1 is provided.
Figure 2B:
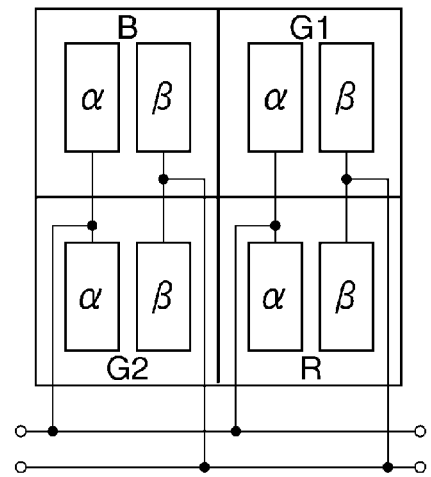
Figure 2C:
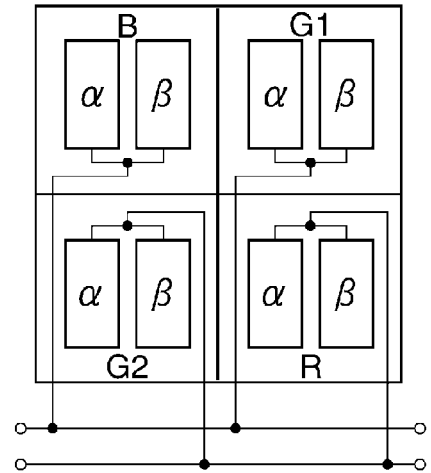

FIG. 2A, FIG. 2B, and FIG. 2C are plan views schematically showing first, second, and third examples of the image pickup device (image sensor) with which the image pickup unit 22 shown in FIG. 1 is provided.

In FIG. 2A, FIG. 2B, and FIG. 2C, a two-dimensional area sensor that consists of four pixels of two lines and two rows is shown. Then, a pair of photoelectric conversion elements $\alpha$ and $\beta$ are formed in each pixel. Object images obtained from different viewpoints are respectively formed on these photoelectric conversion elements $\alpha$ and $\beta$.

Figure 3A:
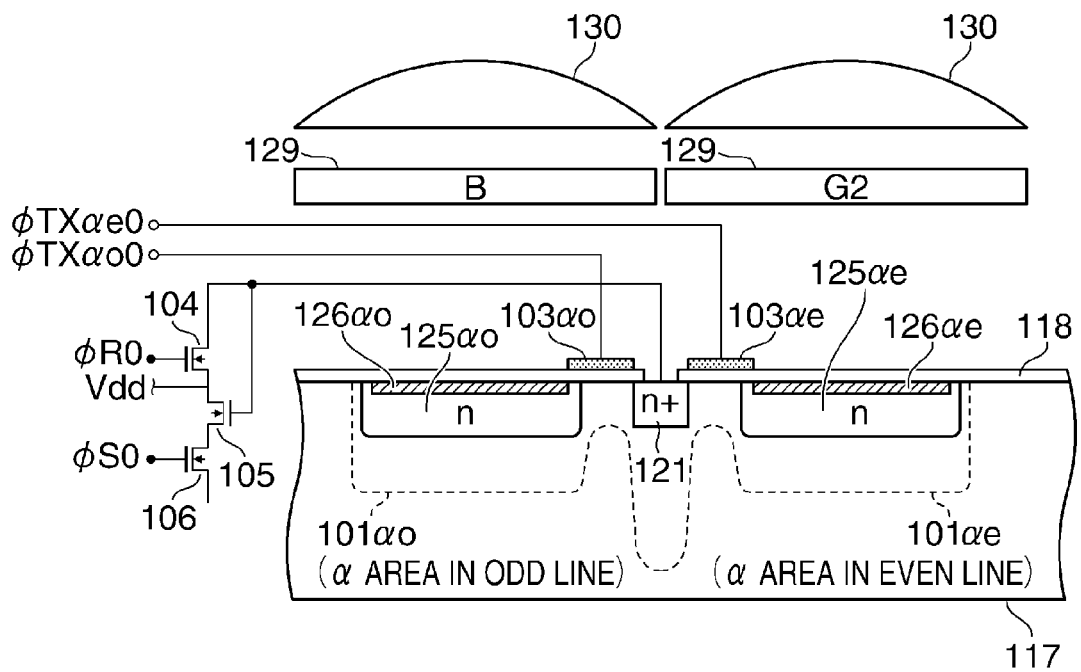
FIG. 3A is a sectional view of the image sensor shown in FIG. 2A taken along the line A-A'.
Figure 3B:
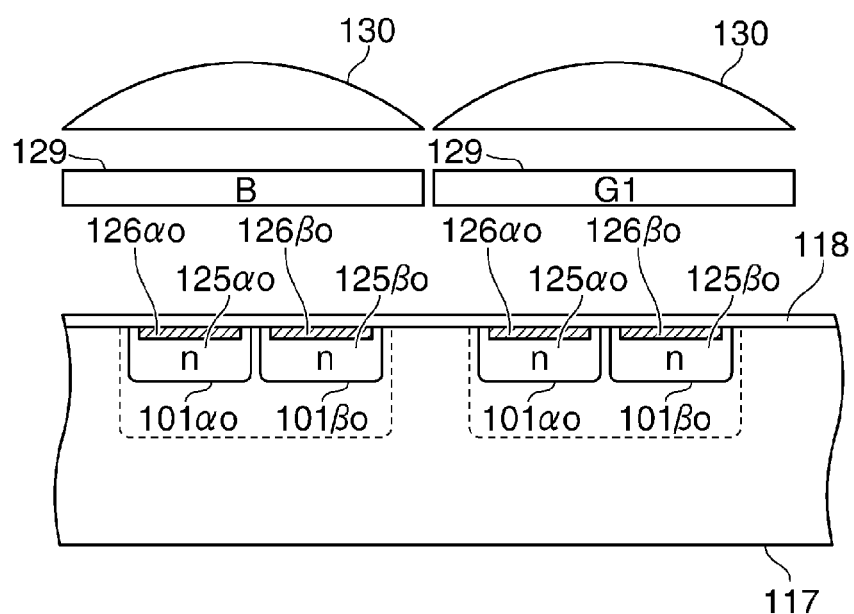
FIG. 3B is a sectional view of the image sensor shown in FIG. 2A taken along the line B-B'.

FIG. 3A is a sectional view of the image sensor shown in FIG. 2A taken along the line A-A'. FIG. 3B is a sectional view of the image sensor shown in FIG. 2A taken along the line B-B'.

In FIG. 3A and FIG. 3B, subscripts $\alpha$ and $\beta$ are respectively added to reference numerals of parts constituting the photoelectric conversion elements $\alpha$ and $\beta$. Subscripts "o" and "e" are respectively added to reference numerals of parts in an odd line and an even line.

As shown in FIG. 3A and FIG. 3B, a substrate is configured by forming n-type regions 125 in a p-type well 117. Then, the n-type regions 125 generate and accumulate photoelectric charges together with the p-type well 117. The photoelectric charges accumulated in the n-type regions 125 are transmitted to a floating diffusion section (hereinafter referred to as an FD section) 121. Surface p+ layers 126 collect the photoelectric charges in order to transmit the photoelectric charges accumulated in the n-type regions 125 to the FD section 121 efficiently. Transfer gates 103 transmit the photoelectric charges to the FD section 121.

Moreover, $SiO_2$ films that are gate insulating films 118 are formed on the substrate. Color filters are arranged based on a Bayer array corresponding to the n-type regions 125, respectively. Then, micro lenses (MLs) 130 for collecting lights are arranged above the color filters 129.

It should be noted that position and shape of the ML 130 are determined so that the pupil of the photographing lens 103a is optically conjugate to the photoelectric conversion elements α and β (i.e., the pupil is divided). Moreover, regions 101 are schematic regions for generating photoelectric charges.

A resetting MOS transistor 104 resets the FD section 121 etc. to reset potential (Vdd) in response to a reset pulse ΦR0. A source follower amplifier MOS transistor 105 outputs an amplified signal corresponding to the photoelectric charge transmitted to the FD section 121. A level selection switch MOS transistor 106 reads an amplified signal that is output from the source follower amplifier MOS transistor 105 to a vertical output line.

It should be noted that the transfer gate 103 is independently controlled by control pulses ΦTXαe0 and ΦTXαo0, respectively.

Figure 4:
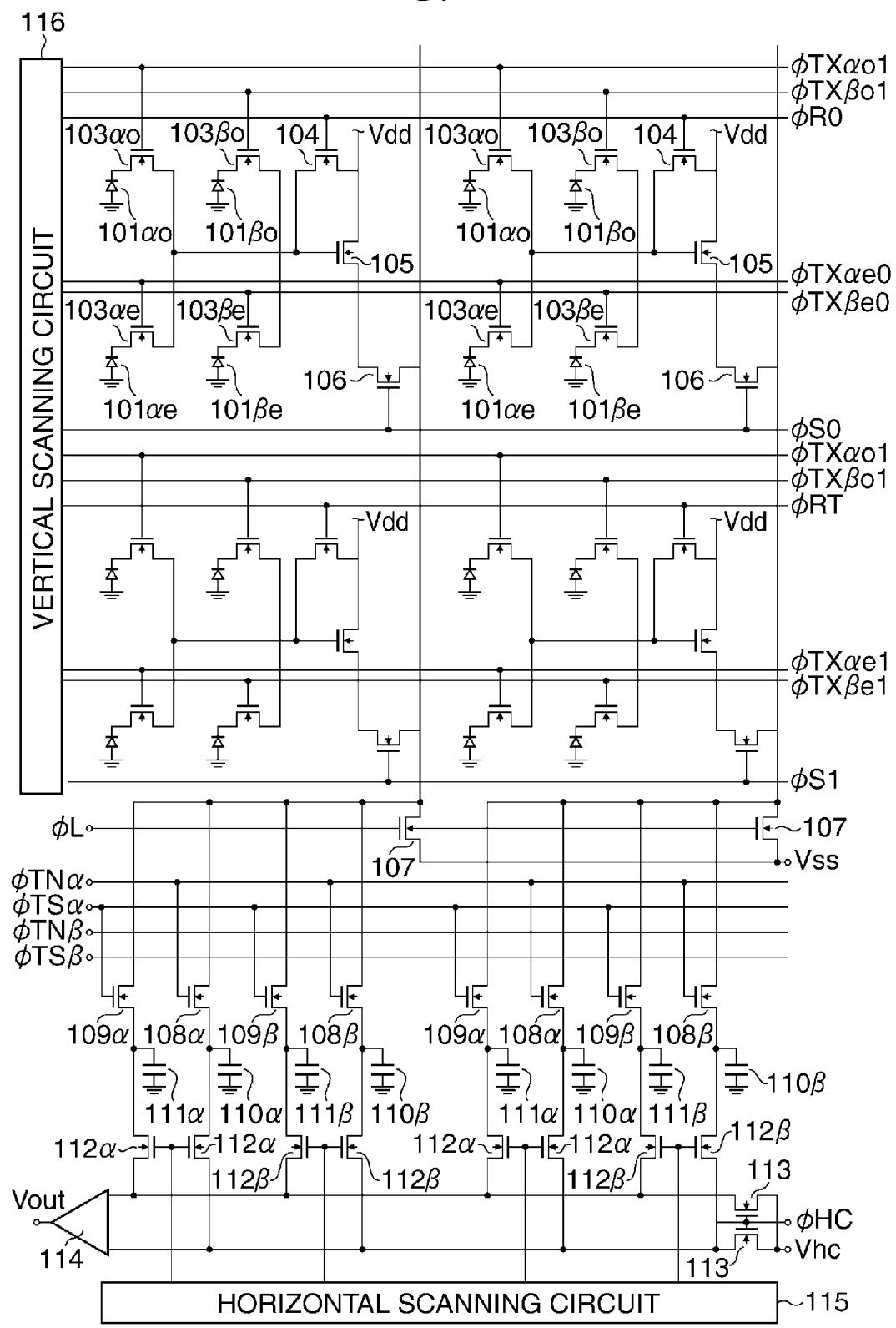
FIG. 4 is a view schematically showing a circuit configuration of the image sensor shown in FIG. 2A and its periphery.

FIG. 4 is a view schematically showing a circuit configuration of the image sensor shown in FIG. 2A and its periphery.

Components in FIG. 4 that are identical to the components shown in FIG. 3A and FIG. 3B are labeled with the same reference numerals or the same referential signs. As illustrated, load MOS transistors 107 for source follower are connected to vertical output lines. Furthermore, dark-output transfer MOS transistors 108 and light-output transfer MOS transistors 109 are connected to the vertical output lines. Then, dark-output storage capacitances (CTN) 110 are connected to the dark-output transfer MOS transistors 108, and light-output storage capacitances (CTS) 111 are connected to the light-output transfer MOS transistors 109.

Furthermore, the dark-output transfer MOS transistors 108 and the light-output transfer MOS transistors 109 are connected to a differential output amplifier 114 through horizontal transfer MOS transistors 112, respectively. Horizontal output line reset MOS transistors 113 are connected to horizontal output lines connected to the differential output amplifier 114. A horizontal scanning circuit 115 and a vertical scanning circuit 116 control ON/OFF of the above-mentioned transistors and read image signals by a known method.

Figure 5:
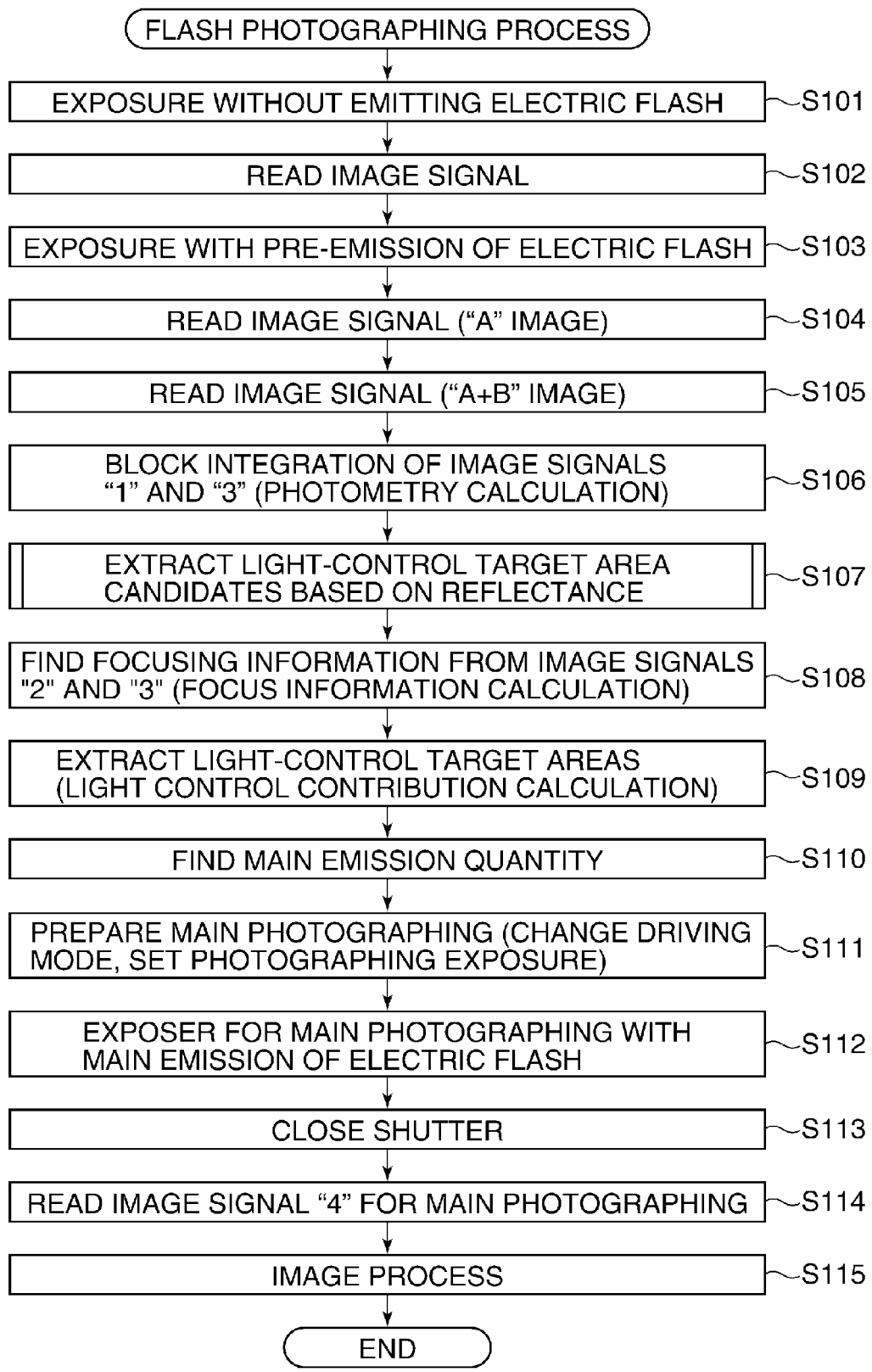
FIG. 5 is a flowchart showing a photographing process with flash emission (flash photographing) performed with the camera shown in FIG. 1.

FIG. 5 is a flowchart showing a photographing process with flash emission (flash photographing) performed with the camera shown in FIG. 1. It should be noted that the process of the illustrated flowchart is executed under the control by the system control unit 50.

Figure 6:
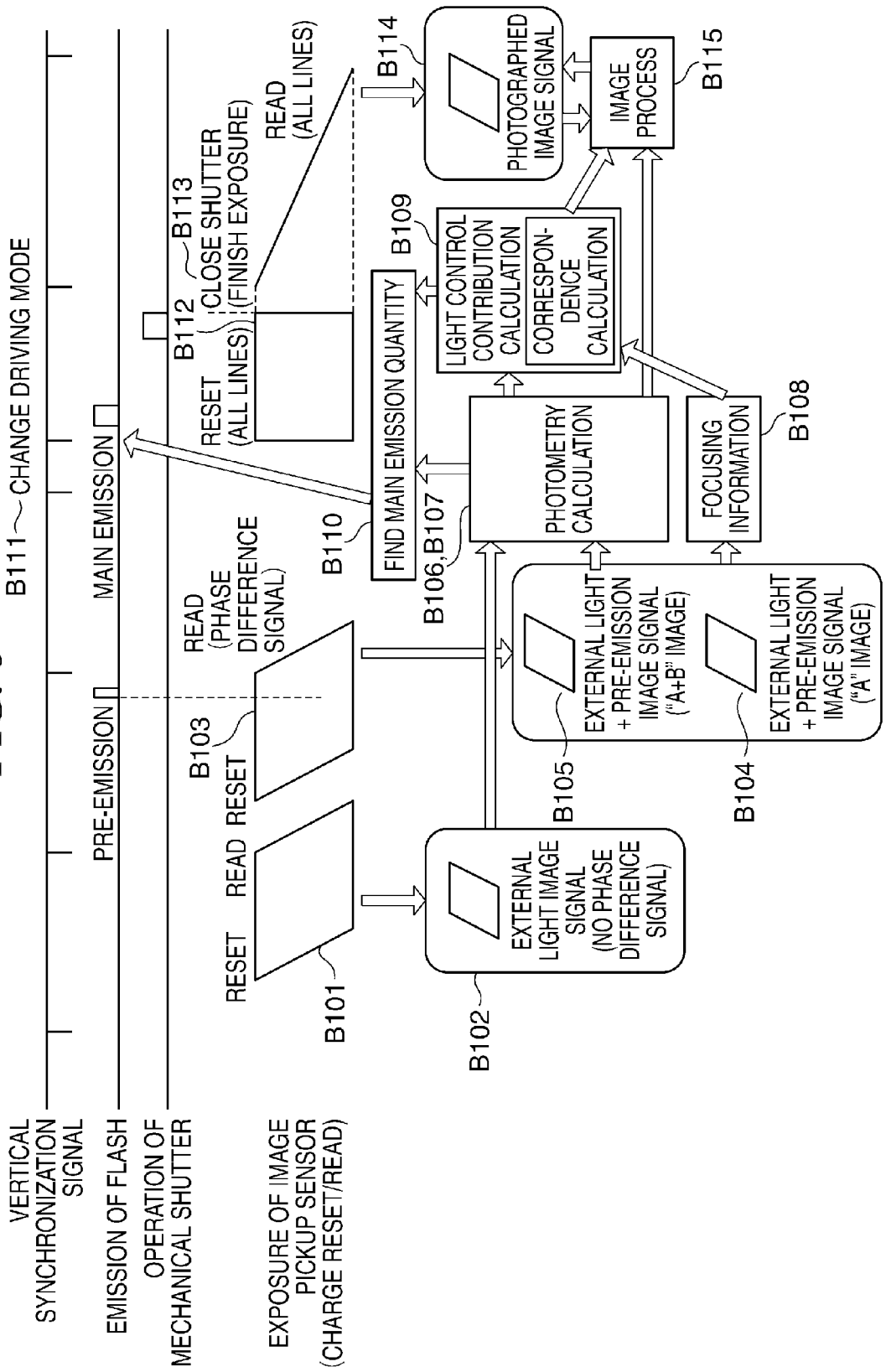
FIG. 6 is a timing chart showing a flow of the flash photographing process shown in FIG. 5.

Moreover, FIG. 6 is a timing chart showing a flow of the flash photographing process shown in FIG. 5. It should be noted that a step S shown in FIG. 5 corresponds to a timing B shown in FIG. 6.

As shown in FIG. 5 and FIG. 6, when the shutter release button 61 is half-pressed and the first shutter switch turns ON, the system control unit 50 performs the AF control as mentioned above. Then, when the shutter release button 61 is pressed fully and the second shutter switch 64 turns ON, the system control unit 50 starts a flash photographing sequence according to the still image recording mode and photographing conditions that have been set.

First, the system control unit 50 exposes the image pickup unit 22 without emitting the electric flash 90 (no-emission) in order to measure an extraneous light quantity (step S101 and timing B101). Subsequently, the system control unit 50 controls the image pickup unit 22 to read an image signal (step S102 and timing B102). Here, the image signal read in the process in the step S102 shall be an image signal "1" (a non-emission image: a first image).

Next, the system control unit 50 pre-emits the electric flash 90 with a predetermined emission quantity, and exposes the image pickup unit 22 (step S103 and timing B103). Then, the system control unit 50 controls the image pickup unit 22, and reads an image signal (step S104 and timing B104). In this case, the image signal ("A" image, a first phase difference signal) is read from the group of pixels (i.e., a part of a plurality of pixels) to which the subscript α is added in FIG. 2. The image signal read in the process in the step S104 shall be an image signal "2" (a second image).

Subsequently, the system control unit 50 controls the image pickup unit 22, and reads an image signal ("A+B" image) that is obtained by adding the image signal of the group of pixels to which the subscript β is added in FIG. 2 to the "A" image (step S105 and timing B105). The image signal read in the process in the step S105 shall be an image signal "3" (a pre-emission image: a third image).

Next, the system control unit 50 performs block integration of the image signals "1" and "3", respectively, and computes the luminance level for every block (photometry calculation) on the basis of the block integration result concerned (step S106 and timing B106). Then, the system control unit 50 performs a light-control target area candidate extracting process on the basis of reflectance of an object at the time of the pre-emission of the electric flash 90 (step S107 and timing B107).

Figure 7A:
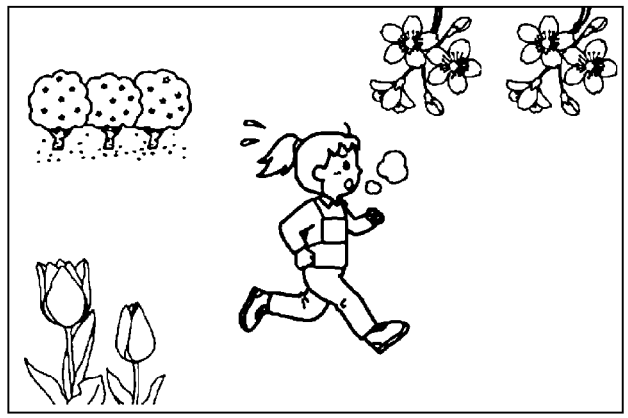
FIG. 7A is a view showing an example of an image photographed with the camera shown in FIG. 1.
Figure 7B:
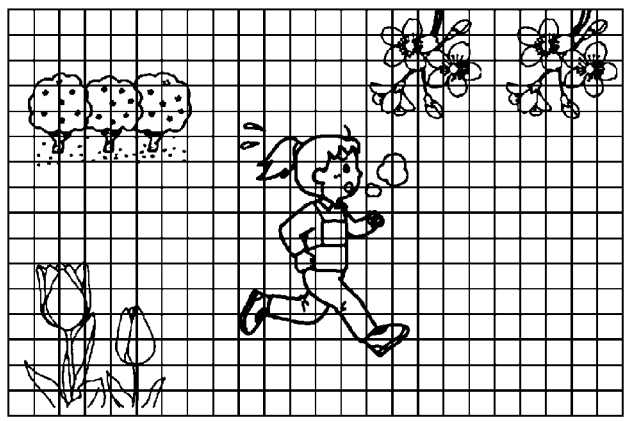
FIG. 7B is a view showing an example of a block integration frame overlapped on the image shown in FIG. 7A for finding luminance values of respective blocks.
Figure 7C:
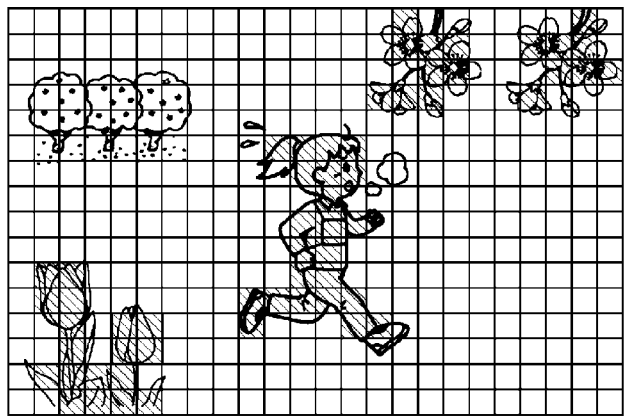
FIG. 7C is a view showing light-control areas giving priority to reflectance extracted using the luminance levels that are found for the respective blocks shown in FIG. 7B.

FIG. 7A is a view showing an example of an image photographed with the camera shown in FIG. 1. FIG. 7B is a view showing an example of a block integration frame overlapped on the image shown in FIG. 7A for finding luminance values of respective blocks. Moreover, FIG. 7C is a view showing light-control areas giving priority to reflectance extracted using the luminance levels that are found for the respective blocks shown in FIG. 7B.

As shown in FIG. 7A, a plurality of objects exist in this image. The system control unit 50 divides the image shown in FIG. 7A into a plurality of blocks as shown in FIG. 7B, allocates each block concerned to a block integration frame, and finds a luminance value for every block integration frame concerned. That is, the system control unit 50 computes the luminance level (luminance value) for every block integration frame by performing the block integration for every block integration frame. Then, the system control unit 50 extracts light-control areas giving priority to reflectance as shown by hatching in FIG. 7C using the luminance level found for every block.

Figure 8:
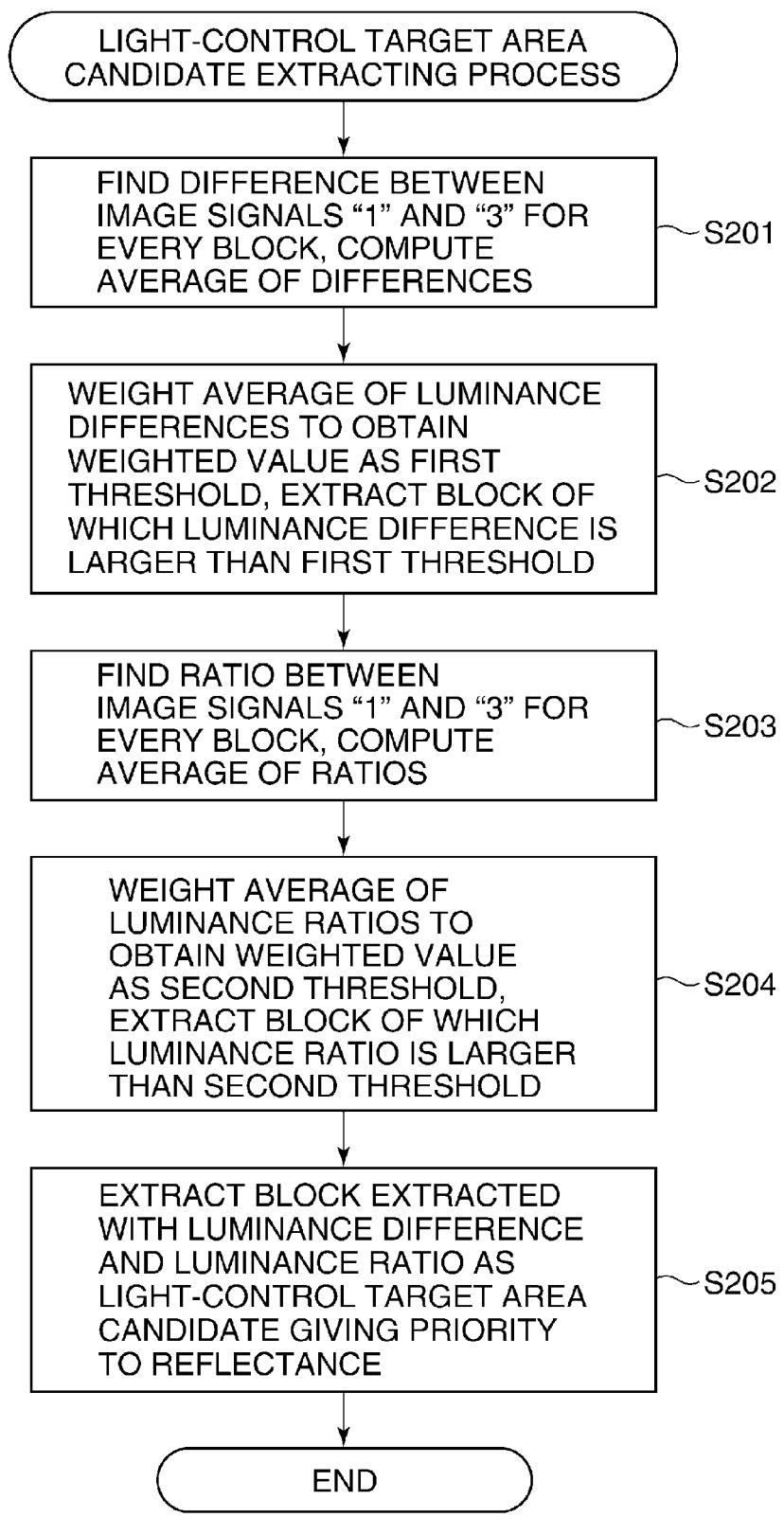
FIG. 8 is a flowchart showing a light-control target area candidate extracting process executed in the step S107 in FIG. 5.

FIG. 8 is a flowchart showing a light-control target area candidate extracting process executed in the step S107 in FIG. 5.

When the light-control target area candidate extracting process starts, the system control unit 50 finds a difference (a luminance difference) between the block integration results of the image signals "1" and "3" for every block. Then, the system control unit 50 computes the average of these differences (i.e., the average of the luminance differences) (step S201).

Next, the system control unit 50 weights the average of the luminance differences (the luminance difference average) by a design parameter, and obtains a weighted luminance difference average. Then, the system control unit 50 uses the weighted luminance difference average concerned as a first threshold, and extracts a block of which the luminance difference is larger than this first threshold (step S202).

Subsequently, the system control unit 50 calculates a ratio (i.e., a luminance ratio) of the block integration results of the image signals "1" and "3" for every block. Then, the system control unit 50 computes the average of these ratios (step S203).

Next, the system control unit 50 weights the average of the luminance ratios by a design parameter, and obtains a weighted luminance ratio average. Then, the system control unit 50 uses the weighted luminance ratio average concerned as a second threshold, and extracts a block of which the luminance ratio is larger than this second threshold (step S204).

Next, the system control unit 50 extracts a block that is extracted in the steps S202 and S204 (i.e., a block of which the luminance difference is larger than the first threshold and the luminance ratio is larger than the second threshold) as a light-control target area candidate giving priority to reflectance (step S205). Then, the system control unit 50 finishes the light-control target area candidate extracting process.

When the light-control target area candidates are extracted in this way, the light-control target area candidates giving priority to reflectance are extracted as shown by hatching in FIG. 7C, for example.

Referring back to FIG. 5 and FIG. 6, the system control unit 50 finds focusing information from the image signals "2" and "3" (step S108 and timing B108) after processing the step S107.

Figure 9:
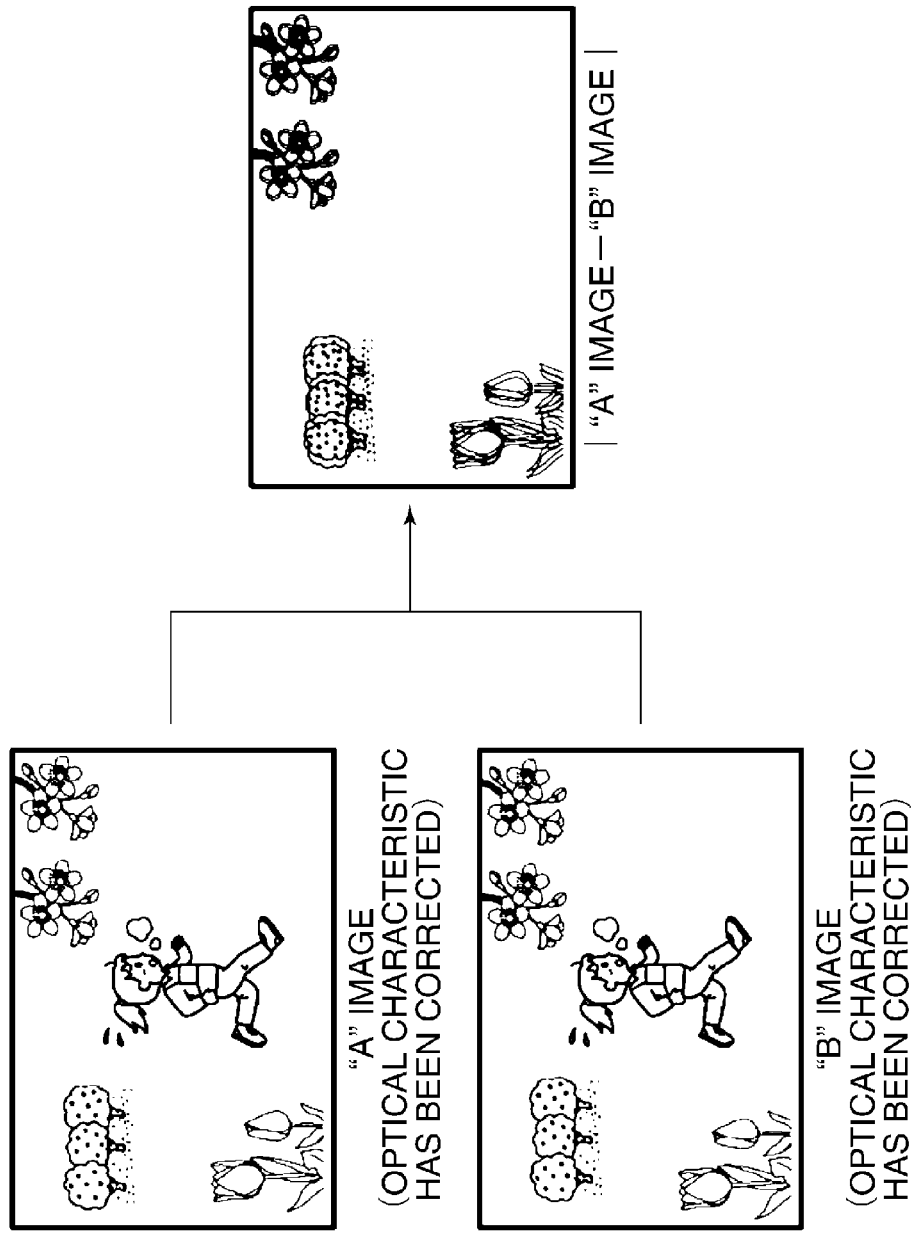
FIG. 9 is a view for describing an example of a focusing information calculation shown in FIG. 5.

FIG. 9 is a view for describing an example of a focusing information calculation shown in FIG. 5.

When finding focusing information, the system control unit 50 first finds the "A" image (the image signal "2") and a "B" image (a second phase difference signal) that is obtained by subtracting the image signal "2" from the image signal "3". The "A" image and the "B" image are respectively formed by lights that transit different areas of the photographing lens 103*a* (the optical system) and that excite photoelectric conversion in the image sensor. Accordingly, the "A" image and the "B" image are corrected in order to remove or reduce the effect (i.e., the optical characteristic of the photographing lens 103*a* is corrected).

The difference between image levels of the "A" image and the "B" image becomes small in an focused area. Then, when the absolute value of the difference (signal difference) between the "A" image and the "B" image is found, the absolute value becomes large in a defocus area, and becomes nearly zero in a focused area.

Since the AF control starts at the time when the first shutter switch turns ON before photographing as mentioned above, when a main object that a user desires is focused, the information about defocus areas (i.e., the absolute value of the difference between the "A" image and the "B" image) shall be the focusing information. Then, the focusing information is used for the light-control target area extraction at the time of finding the main emission quantity of the electric flash 90 as mentioned later.

It should be noted that the difference (with a sign) between the "A" image and the "B" image may be used as the focusing information in place of the absolute value of the difference between the "A" image and the "B" image, for example, or distance map information according to defocus amounts that are found from the image signals "2" and "3" may be used.

After the process in the step S108, the system control unit 50 extracts the light-control target areas used for a light-control calculation (a light control contribution calculation) (step S109 and timing B109).

FIG. 10 is a view for describing extraction of a light-control target area shown in FIG. 5. Here, the system control unit 50 extracts a light-control target area according to the light-control target area candidates and the focusing information.

The system control unit 50 performs a correspondence calculation that allocates the focusing information at a plurality of positions to a plurality of blocks, and excludes defocus areas from the light-control target area candidates. For example, assuming that the focusing information shows the absolute value of the difference, the system control unit 50 excludes a block of which the focusing information is more than a predetermined third threshold from the light-control target areas.

Furthermore, the system control unit 50 changes the contribution (weight) of the light-control target area that remains without being excluded according to the reflectance at the time of the pre-emission of the electric flash 90 for extracting the light control target area candidate and the position of the light-control target area in the screen. For example, the system control unit 50 raises the contribution of the area of which the pre-emission reflectance is high, and raises the contribution of the area closer to the center position in the screen. It should be noted that when a main object is detected with face detection etc., the contribution of the detected area concerned is raised.

When there is no light-control target area as a result of the above-mentioned process, the system control unit 50 raises the threshold (i.e., the third threshold) used for excluding from the light-control target areas according to the focusing information. Then, when a light-control target area is not obtained even if the third threshold is raised, the system control unit 50 raises the contribution of the center part of the screen, and lowers the contribution with increasing distance from the center part of the screen.

After the process in the step S109, the system control unit 50 finds a main emission quantity so that the light-control target area gets proper luminance at the time of the main photographing (step S110 and timing B110).

Here, the system control unit 50 finds luminance level information DayY by weighting the luminance level in the light-control target area according to the contribution in the image signal "1". Furthermore, the system control unit 50 obtains luminance level information PreY by weighting the luminance level in the light-control target area according to the contribution in the image signal "2". Then, the system control unit 50 finds a main emission quantity (ΔhEF1) by the following formula (1) by setting a target brightness level to RefY.

[Formula 1]

$$\Delta hEF1 = \text{Log}_2 \frac{RefY - DayY}{PreY - DayY}$$

It should be noted that the ΔhEF1 indicates the number of steps (the number of powers of "2") of brightness that is required for the main emission with reference to the pre-emission quantity in order to obtain correct exposure in the light-control target area.

Subsequently, the system control unit 50 prepares the main photographing (step S111 and timing B111). Here, the system control unit 50 changes the driving mode of the image pickup unit 22, and sets the photographing exposure. Furthermore, when the AF control is performed according to the image signals (i.e., the phase difference signals) read in the steps S104 and S105, the system control unit 50 drivingly controls the focus lens.

Next, the system control unit 50 exposes the image pickup unit 22 for the main photographing and emits the electric flash 90 as the main emission with the emission quantity corresponding to the ΔhEF1 (step S112 and timing B112). Then, the system control unit 50 closes the shutter 101, and finishes exposure of the image pickup unit 22 (step S113 and timing B113).

Then, the system control unit 50 reads the main photographing image signal (an image signal "4") from the image pickup unit 22 (step S114 and timing B114). Then, the system control unit 50 controls the image processing unit 24 to apply the image process to the image signal "4" (step S115 and timing B115).

In the process in the step S115, the image processing unit 24 divides the image signal "4" into a plurality of areas, and performs luminance correction and white balance (WB) correction for every area on the basis of the result of the photometry calculation and the focusing information for the image signals "2" and "3".

For example, the image processing unit 24 finds a flashlight/external-light ratio for every area based on the pre-emission reflectance and the ΔhEF1, and computes a flash-light overexposure quantity for an object located nearer than the main object on the basis of the focusing information. Then, the image processing unit 24 performs the luminance correction and the WB correction for every area on the basis of the flash-light/external-light ratio and the flash-light overexposure quantity.

After that, the image processing unit 24 performs the correction, development, and compression processes mentioned above under the control of the system control unit 50, stores the image data into the nonvolatile memory 56. Furthermore, the image processing unit 24 displays a review screen on the display unit 28. Then, the system control unit 50 finishes the flash photographing.

Thus, the embodiment of the present invention enables to extract the main object correctly at the time of flash photographing, and to control the emission quantity so that the main object is photographed with the proper luminance.

The above-mentioned description clearly shows that the electric flash 90, the image processing unit 24, and the system control unit 50 constitute the light emission control device in the example shown in FIG. 1. Moreover, the system control unit 50 functions as the extraction unit, the calculation unit, the area selection unit, and the control unit. Furthermore, the system control unit 50 functions as a luminance computation unit, difference computation unit, and ratio computation unit, first selection unit, second selection unit, and third selection unit.

Although the embodiments of the present invention have been described, the present invention is not limited to the above-mentioned embodiments, the present invention includes various modifications as long as the concept of the invention is not deviated.

For example, the functions of the above mentioned embodiments may be achieved as a control method that is executed by the light emission control device. Moreover, the functions of the above mentioned embodiments may be achieved as a control program that is executed by a computer with which the light emission control device is provided. It should be noted that the control program is recorded into a computer-readable storage medium, for example.

Other Embodiments

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2014-198502, filed Sep. 29, 2014, which is hereby incorporated by reference herein in its entirety.

What is claimed is:
1. An image pickup apparatus comprising:
an image pickup device that receives a pair of light beams that pass through different pupil division areas of an imaging optical system with a pair of photoelectric conversion sections;
an emission unit that illuminates an object;
an extraction unit configured to extract light-control target area candidates from a pre-emission image that is obtained by pre-emitting said emission unit using a non-emission image and the pre-emission image;
a calculation unit configured to find focused areas and defocus areas in the pre-emission image based on the pre-emission image;
a selection unit configured to select a light-control target area that should be a target of light control from the light-control target area candidates according to information based on the focused areas; and
a control unit configured to control emission quantity of said emission unit at a time of photographing so that luminance in the light-control target area becomes predetermined luminance,
wherein said calculation unit finds the information about the focused areas based on difference information between a first phase difference signal read from one photoelectric conversion section of the pair of photoelectric conversion sections and a second phase difference signal read from the other photoelectric conversion section of the pair of photoelectric conversion sections.

2. The image pickup apparatus according to claim 1, wherein the first phase difference signal is a signal read from one photoelectric conversion section of said pair of photoelectric conversion sections, and the second phase difference signal is a signal that is obtained by subtracting the first phase difference signal from a total signal that is read by adding electric charges of the pair of photoelectric conversion sections.

3. The image pickup apparatus according to claim 1, wherein the information about the focused areas comprises an absolute value of a difference between the first phase difference signal and the second phase difference signal, and
wherein the selection unit selects, as the light-control target area, one of the light-control target area candidates, of which the absolute value is less than a predetermined threshold, and does not select, as the light-control target area, the light-control target area candidates, each of which the absolute value is not less than the predetermined threshold.

4. A control method for an image pickup apparatus that is provided with an image pickup device that receives a pair of light beams that pass through different pupil division areas of an imaging optical system with a pair of photoelectric conversion sections and an emission unit that illuminates an object, the control method comprising:
an extraction step of extracting light-control target area candidates from a pre-emission image that is obtained by pre-emitting the emission unit using a non-emission image and the pre-emission image;
a calculation step of finding focused areas and defocus areas in the pre-emission image based on the pre-emission image;
a selection step of selecting a light-control target area that should be a target of light control from the light-control target area candidates according to information about the focused areas; and
a control step of controlling emission quantity of the emission unit at a time of photographing so that luminance in the light-control target area becomes predetermined luminance,
wherein the information about the focused areas is found based on difference information between a first phase difference signal read from one photoelectric conversion section of the pair of photoelectric conversion sections and a second phase difference signal read from the other photoelectric conversion section of the pair of photoelectric conversion sections in said calculation step.

5. A non-transitory computer-readable storage medium storing a control program causing a computer to execute a control method for an image pickup apparatus that is provided with an image pickup device that receives a pair of light beams that pass through different pupil division areas of an imaging optical system with a pair of photoelectric conversion sections and an emission unit that illuminates an object, the control method comprising:
an extraction step of extracting light-control target area candidates from a pre-emission image that is obtained by pre-emitting the emission unit using a non-emission image and the pre-emission image;
a calculation step of finding focused areas and defocus areas in the pre-emission image based on the pre-emission image;
a selection step of selecting a light-control target area that should be a target of light control from the light-control target area candidates according to information about the focused areas; and
a control step of controlling emission quantity of the emission unit at a time of photographing so that luminance in the light-control target area becomes predetermined luminance,
wherein the information about the focused areas is found based on difference information between a first phase difference signal read from one photoelectric conversion section of the pair of photoelectric conversion sections and a second phase difference signal read from the other photoelectric conversion section of the pair of photoelectric conversion sections in said calculation step.

* * * * *